(12) United States Patent
Babcock et al.

(10) Patent No.: US 8,792,243 B2
(45) Date of Patent: *Jul. 29, 2014

(54) CARRIAGE CHASSIS WITH A TRI-LOBED TORSION STOP

(75) Inventors: Raymond F. Babcock, Stewartville, MN (US); Michael A. Boraas, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 107 days.

This patent is subject to a terminal disclaimer.

(21) Appl. No.: 13/527,791

(22) Filed: Jun. 20, 2012

(65) Prior Publication Data

US 2012/0257353 A1 Oct. 11, 2012

Related U.S. Application Data

(63) Continuation of application No. 12/815,859, filed on Jun. 15, 2010, now Pat. No. 8,254,131.

(51) Int. Cl.
*H05K 5/00* (2006.01)
*H05K 7/00* (2006.01)

(52) U.S. Cl.
USPC ...... 361/727; 361/679.02; 361/724; 361/725; 361/726

(58) Field of Classification Search
USPC .............. 361/679.02, 724, 725, 726, 727
See application file for complete search history.

(56) References Cited

U.S. PATENT DOCUMENTS

| | | | |
|---|---|---|---|
| 6,232,676 B1 | 5/2001 | Kozyra et al. | |
| 6,671,181 B2 | 12/2003 | Kaminski et al. | |
| 6,898,088 B2 | 5/2005 | Megason et al. | |
| 7,251,143 B2 | 7/2007 | Magnoux et al. | |
| 7,595,995 B2 * | 9/2009 | Hock .......................... | 361/727 |
| 7,633,760 B2 * | 12/2009 | Wu et al. ...................... | 361/727 |
| 7,881,062 B2 * | 2/2011 | Chen et al. ................... | 361/725 |
| 2011/0304988 A1 | 12/2011 | Babcock et al. | |

OTHER PUBLICATIONS

Notice of Allowance, U.S. Appl. No. 12/815,859, Apr. 24, 2012, 12 pp.

* cited by examiner

*Primary Examiner* — Anthony Haughton
(74) *Attorney, Agent, or Firm* — Edward J. Lenart; Katherine S. Brown; Biggers Kennedy Lenart Spraggins LLP

(57) ABSTRACT

Carriage chassis for installation of a component assembly in a support structure. The support structure includes a power connector in a connector housing. The carriage chassis includes: rails adapted to receive a component assembly and a safety cover. One of the rails includes a tri-lobed torsion stop that includes a first lobe configured to contact the connector housing when no safety cover is installed, preventing a component assembly from coupling with power; a second lobe configured to receive contact from a displacement member of a safety cover, rotating the tri-lobed torsion stop; and a third lobe configured to provide contact to the displacement member when the safety cover is installed and a component assembly is coupled with power. The third lobe and the first lobe prevent removal of the safety cover when a component assembly is coupled with the power connector.

16 Claims, 4 Drawing Sheets

CARRIAGE CHASSIS WITH A TRI-LOBED TORSION STOP

CROSS-REFERENCE TO RELATED APPLICATION

This application is a continuation application of and claims priority from U.S. patent application Ser. No. 12/815,859, filed on Jun. 15, 2010.

STATEMENT REGARDING FEDERALLY SPONSORED RESEARCH OR DEVELOPMENT

This invention was made with Government support under Contract No. H98230-08-C-1295 awarded by Maryland Procurement Office. The Government has certain rights in this invention.

BACKGROUND OF THE INVENTION

1. Field of the Invention

The field of the invention is data processing, and more specifically, carriage chassis with tri-lobed torsion stops and support structures for installation of carriage chassis with tri-lobed torsion stops.

2. Description of Related Art

In development environments computer components, electronics, and other electrical components from time to time are tested and debugged. In some environments, such components require high voltage test systems. Such high voltage may be dangerous to personnel performing tests on the components. One such environment, for example, includes support structure that provides power, testing equipment, and various docking or mounting options for components under test. In this example environment, components under test may be mounted or installed in the support structure by means of a carriage chassis. Such components under test may comprise an assembly of two 'cards' each of which includes a plurality of printed circuit boards (PCBs) with electrical components and a liquid-cooled cold plate that provides cooling to the electrical components of the PCBs. This cold plate/card assembly may be very large and very heavy, in some cases, several hundred pounds. This example assembly is typically fashioned with one card on either side of the cold plate. When power is applied to the assembly, dangerously high voltage is available at various points of the cards. To protect personnel from contacting these voltage points, a safety cover is inserted. The safety cover at present, however, may be removed while power is being provided to the card/cold plate assembly.

SUMMARY OF THE INVENTION

A carriage chassis for installation of a component assembly in a support structure is disclosed. In embodiments of the present invention, the support structure includes a power connector in a connector housing, where the power connector is adapted to couple to a component assembly installed in the carriage chassis. The carriage chassis includes a number of rails adapted to receive a component assembly and adapted to receive a safety cover. At least one of the rails includes a tri-lobed torsion stop. The tri-lobed torsion stop includes a first lobe configured to contact the connector housing when no safety cover is installed in the carriage chassis, thereby preventing a component assembly installed in the carriage chassis from coupling with the power connector; a second lobe configured to receive contact from a displacement member of a safety cover upon installation of the safety cover in the carriage chassis, thereby rotating the tri-lobed torsion stop; and a third lobe configured to provide contact to the displacement member of the safety cover when the safety cover is installed in the carriage chassis and a component assembly installed in the carriage chassis is coupled with the power connector. In embodiments of the present invention, the first lobe is configured, when the safety cover is installed in the carriage chassis and a component assembly installed in the carriage chassis is coupled with the power connector, for insertion into a connector housing receptacle adapted to prevent rotation of the tri-lobed torsion stop and the third lobe and the first lobe prevent removal of the safety cover when the safety cover is installed in the carriage chassis and a component assembly installed in the carriage chassis is coupled with the power connector.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
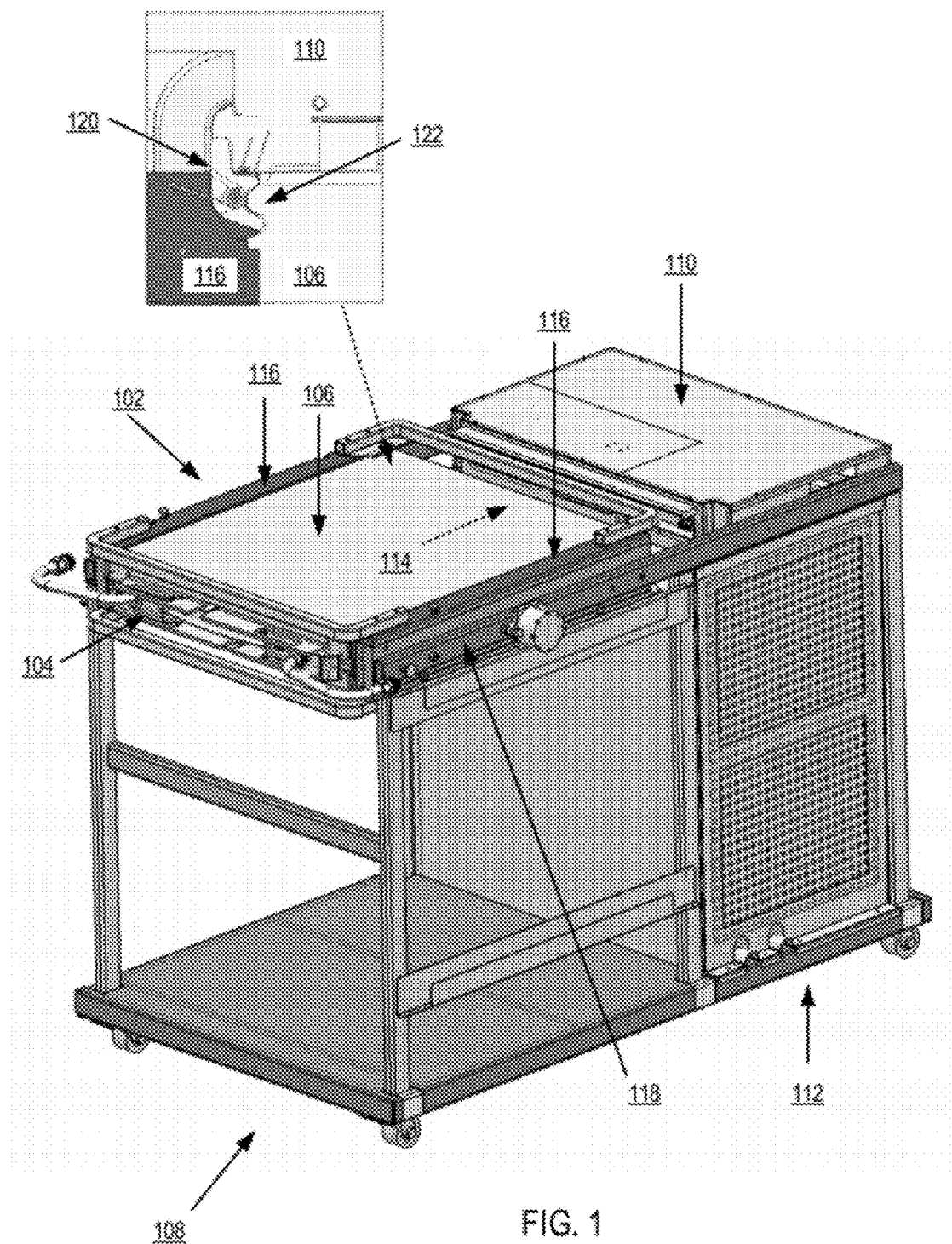
FIG. 1 sets forth a line drawing of an exemplary system that includes a support structure in which is installed a carriage chassis with a tri-lobed torsion stop according to embodiments of the present invention.

Exemplary carriage chassis with a tri-lobed torsion stop in accordance with the present invention and support structures in which such carriage chassis are installed are described with reference to the accompanying drawings, beginning with FIG. 1. FIG. 1 sets forth a line drawing of an exemplary system that includes a support structure in which is installed a carriage chassis with a tri-lobed torsion stop according to embodiments of the present invention. The system of FIG. 1 includes a support structure (108). The example support structure (108) of FIG. 1 may be implemented as a test fixture in which components are tested, debugged, and the like. The example support structure (108) includes rack (112) that includes a plurality of slots in which may be installed computers, testing apparatus, power supplies, routers, switches, hard drives, and so on as will occur to readers of skill in the art.

The example support structure (108) of FIG. 1 also includes a power connector housing (110) which includes, in turn, a power connector. The power connector housing (110) may also include a power supply or other electrical equipment. The power connector is adapted to couple to a component assembly installed in a carriage chassis and provide power to the component assembly.

Installed in the example support structure of FIG. 1 is a carriage chassis (102). The example carriage chassis (102) of FIG. 1 includes several rails (116) adapted to receive a component assembly and adapted to receive safety covers. The rails (116) are also adapted for installation into the support structure. The rails (116) of the carriage chassis (102) translate parallel to rails (118) of the support structure on ball bearings, a sliding mechanism, or some other apparatus as will occur to readers of skill in the art. In this way, the carriage chassis (102) may translate toward and away from the power connector and connector housing (110).

The carriage chassis (102) in the example of FIG. 1 includes a component assembly (104). The component assembly (104), in this example, includes two cards containing a number of PCBs and a liquid-cooled cold plate. One card is located on a top side of the cold plate and the other card is located on the bottom side of the cold plate. In some embodiments, the component assembly (104) may be installed in the carriage chassis (102) by sliding the component assembly (104) into the carriage chassis (102) in the direction (114) depicted in FIG. 1. Although the component assembly (104) in the example of FIG. 1 is described as comprising a card/cold plate assembly, readers of skill in the art will recognize that any type of component assembly may be installed in a carriage chassis that includes a tri-lobed torsion stop in accordance with embodiments of the present invention.

To protect personnel handling the component assembly (104) from high voltage connections, safety covers (106) are also installed in example carriage chassis (102) of FIG. 1. The safety covers (106), one on top and one on bottom (not seen in this view), are installed in a similar manner as the component assembly—sliding into the carriage chassis along the rails (116) in the direction (114) toward the power connector and connector housing (110).

In the example of FIG. 1, at least one of the rails (116) of the carriage assembly (102) includes a tri-lobed torsion stop (120). The term 'torsion' is used to describe a tri-lobed stop that rotates, or twists, and stores mechanical energy when twisted. That is, the tri-lobed torsion stop (120) in the example of FIG. 1 rotates from an initial position in one direction when force is applied by a safety cover being installed and rotates back, due to mechanical energy stored during the previous rotation, when the force being applied by a safety cover is removed due to the removal of the safety cover from the carriage chassis. The tri-lobed torsion stop (120) may include a torsion spring to supply such torsion operation.

The tri-lobed torsion stop (120) in the example of FIG. 1 includes a first lobe configured to contact the connector housing (110) only when no safety cover (106) is installed in the carriage chassis (102). That is, in its initial, non-rotated position, the first lobe of the tri-lobed torsion stop (120) prevents the carriage chassis to be translated toward the power connector in such a way that the component assembly installed in the carriage chassis is unable to couple with the power connector. In this way, the tri-lobed torsion stop (120) prevents a component assembly (104) installed in the carriage chassis (102) from coupling with the power connector when no safety cover is installed.

The tri-lobed torsion stop (120) also includes a second lobe configured to receive contact from a displacement member (122) of a safety cover (106) upon installation of the safety cover (106) in the carriage chassis (102), thereby rotating the tri-lobed torsion stop (120). That is, when the safety cover (106) is installed, a displacement member (122) of the safety cover (106) displaces, or pushes, the second lobe of the stop (120), causing the entire stop (120) to rotate from its initial, non-rotated position. When the tri-lobed torsion stop (120) is rotated, the first lobe no longer contacts the connector housing (110), preventing the component assembly (104) from coupling with the power connector. Instead, the first lobe is aligned for insertion into a connector housing receptacle. The connector housing receptacle, as explained below, is adapted to prevent the tri-lobed stop from rotating once the first lobe is inserted into the receptacle. In the example of FIG. 1, the connector housing receptacle is formed by the shape of the connector housing itself—the ninety degree angle cutouts of the corners of the connector housing (110) operate as the connector housing receptacle.

The tri-lobed torsion stop (120) in the example of FIG. 1 also includes a third lobe configured to provide contact to the displacement member (122) of a safety cover (106) when the safety cover (106) is installed in the carriage chassis (102) and a component assembly (104) installed in the carriage chassis (102) is coupled with the power connector. That is, when a safety cover (106) is in the process of removal, the displacement member (122) contacts the third lobe. When a component assembly is not coupled to the power connector, the removal of the safety cover causes the tri-lobed torsion stop (120) to rotate back to its initial position. On the other hand, when a component assembly is coupled to the power connector, the first lobe is inserted into the connector housing receptacle in such a way that prevents rotation of the tri-lobed torsion stop (120). That is, the third lobe of the tri-lobed stop, in conjunction with the first lobe, prevents the safety cover (106) from being removed while the component assembly is coupled to the power connector.

In this way, a component assembly is prevented from being coupled to power when no safety cover is installed and the safety cover is prevented from being removed while the component assembly is coupled to power. Not until the component assembly is removed from power, by translating the carriage chassis with the component assembly away from the power connector and connector housing, may the safety cover be removed. In some embodiments, the carriage chassis includes multiple tri-lobed torsion stops, at least one for each safety plate.

Figure 2:
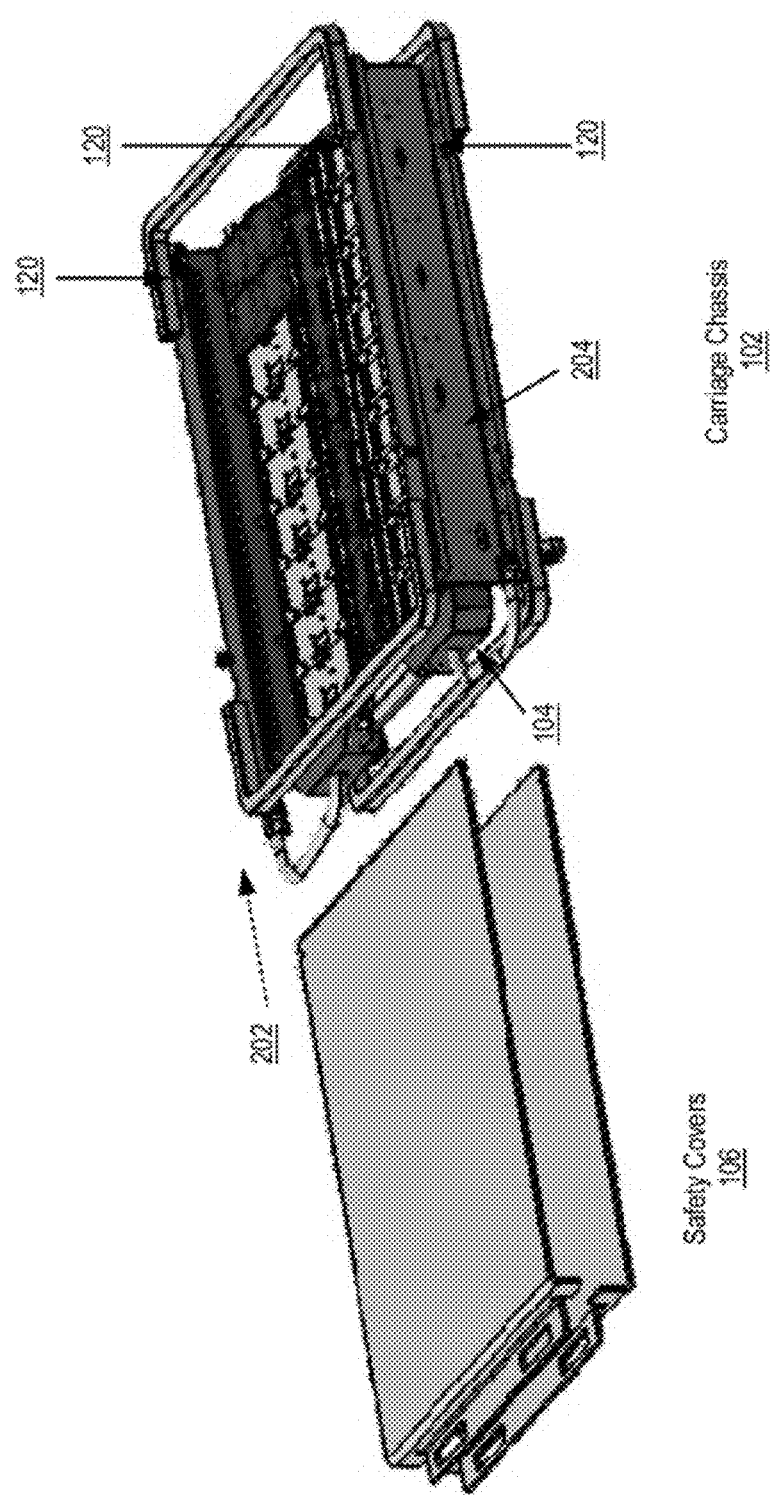
FIG. 2 sets forth an exemplary carriage chassis with a tri-lobed torsion stop in accordance with embodiments of the present invention and a safety cover for installation in the exemplary carriage chassis.

For further explanation, FIG. 2 sets forth an exemplary carriage chassis with a tri-lobed torsion stop in accordance with embodiments of the present invention and a safety cover for installation in the exemplary carriage chassis. The example of FIG. 2 includes a carriage chassis (102) similar to that of the carriage chassis depicted in the example of FIG. 1, but without installed safety covers.

The example carriage chassis (102) of FIG. 2 includes a number of rails (204) adapted to receive a component assembly (104) and adapted to receive a safety cover (106). In the example of FIG. 2, two primary rails (204), parallel to one another, are depicted for receiving a component assembly (104) and safety covers (106). The rails (204) may be adapted to receive a component assembly and safety covers in that the rails may include a sliding mechanism, bearings, a channel, or some other mechanical structure receive a component assembly and safety covers. In the example of FIG. 2, the safety covers (106) may be installed in the carriage chassis (102) in the direction (202) depicted here by sliding the safety covers (106) into a channel of the rails (204) designated for such purpose or by other means as will occur to readers of skill in the art.

At least one of the rails (204) in the example of FIG. 2 includes a tri-lobed torsion stop (120). In fact, in the example carriage chassis (102) of FIG. 2, there may be four tri-lobed torsion stops (120). Each of the stops (120) includes a first lobe configured to contact the connector housing when no safety cover (106) is installed in the carriage chassis (102), thereby preventing a component assembly installed in the carriage chassis (102) from coupling with the power connector; a second lobe configured to receive contact from a displacement member of a safety cover (106) upon installation of the safety cover (106) in the carriage chassis (102), thereby rotating the tri-lobed torsion stop (120); and a third lobe configured to provide contact to the displacement member of the safety cover (106) when the safety cover (106) is installed in the carriage chassis (102) and a component assembly installed in the carriage chassis (102) is coupled with the power connector. In the example of FIG. 2, the first lobe is configured for insertion into a connector housing receptacle adapted to prevent rotation of the tri-lobed torsion stop (120) when the safety cover (106) is installed in the carriage chassis (102) and a component assembly installed in the carriage chassis (102) is coupled with the power connector and the third and first lobes prevent removal of the safety cover (106) when the safety cover (106) is installed in the carriage chassis (102) and a component assembly installed in the carriage chassis (102) is coupled with the power connector.

Figure 3:
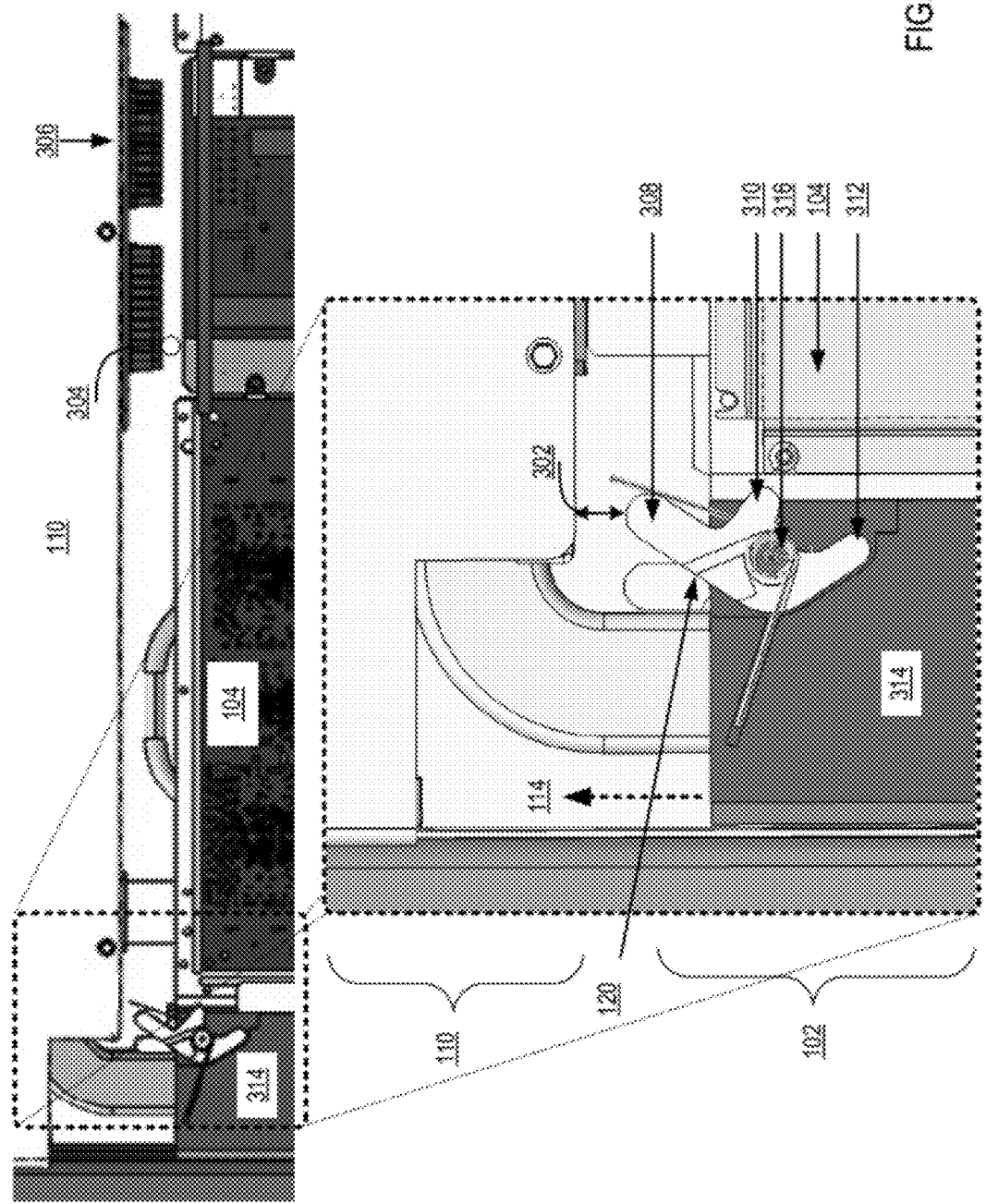
FIG. 3 sets forth a bird's eye view of an exemplary carriage chassis with a tri-lobed torsion stop in accordance with embodiments of the present invention when no safety cover is installed in the carriage chassis.
Figure 4A:
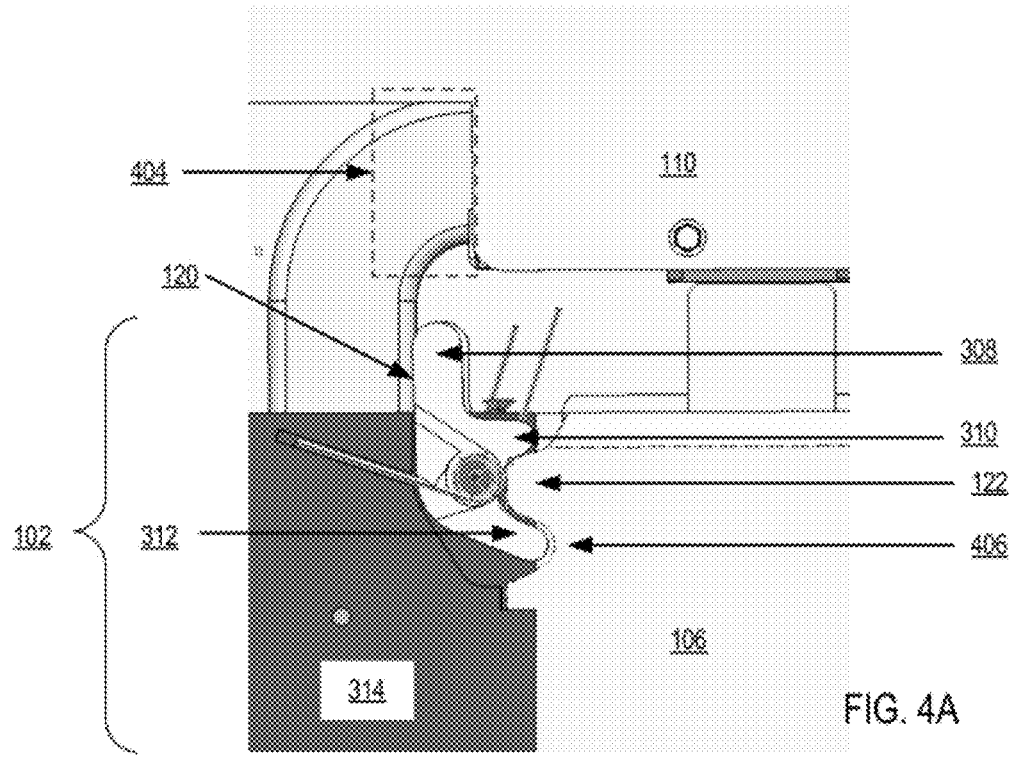
FIG. 4A sets forth a bird's eye view of an exemplary carriage chassis with a tri-lobed torsion stop in accordance with embodiments of the present invention when a safety cover is installed in the carriage chassis and a component assembly installed in the carriage chassis is not coupled with a power connector.
Figure 4B:
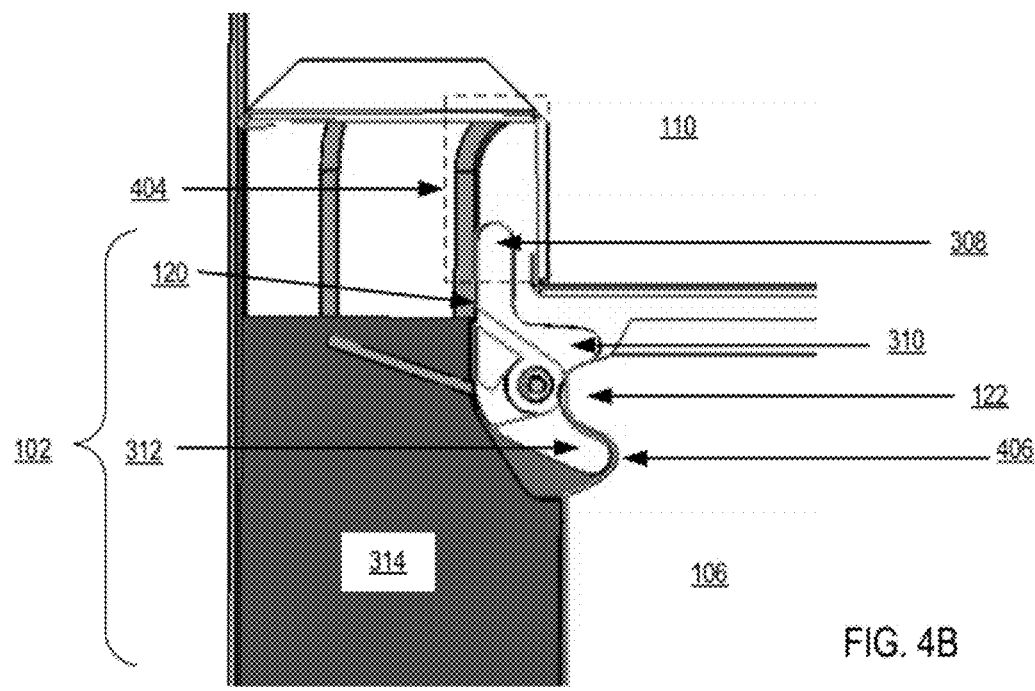
FIG. 4B sets forth a bird's eye view of an exemplary carriage chassis with a tri-lobed torsion stop in accordance with embodiments of the present invention when a safety cover is installed in the carriage chassis and a component assembly installed in the carriage chassis is coupled with a power connector.

For further explanation of the operation of a tri-lobed torsion stop of a carriage chassis configured in accordance with embodiments of the present invention, FIGS. 3, 4A, and 4B depict a carriage chassis with an installed component assembly in progressing stages of installation—a first stage in which no safety cover is installed; a second stage in which a safety cover is installed but the component assembly is not yet coupled with the power connector; and a third stage in which the safety cover is installed and the component assembly is coupled with the power connector.

For further explanation, FIG. 3 sets forth a bird's eye view of an exemplary carriage chassis with a tri-lobed torsion stop in accordance with embodiments of the present invention when no safety cover is installed in the carriage chassis. The example of FIG. 3 includes a carriage chassis (102) installed in a support structure. The support structure in the example of FIG. 3 includes a power connector (306) in a connector housing (110). The power connector (306) is adapted to couple to a component assembly (104) installed in the carriage chassis (102).

The example carriage chassis (102) of FIG. 3 includes a plurality of rails (314), only one of which is depicted here for clarity of explanation. Each rail (314) is adapted to receive a component assembly (104), installed in the example carriage chassis of FIG. 3, and is adapted to receive a safety cover which is not installed in the example carriage chassis of FIG. 3. At least one of the rails (314) includes a tri-lobed torsion stop (120).

The example tri-lobed torsion stop (120) of FIG. 3 is fastened to the rail (314) with a fastener (316), such as a screw, nut and bolt, or the like. The example tri-lobed torsion stop (120) also includes a torsion spring configured to return the tri-lobed torsion stop (120) to a first position—an initial, non-rotated position—upon removal of a safety cover. When the tri-lobed torsion stop is in the first position, the tri-lobed torsion stop (120) prevents coupling of a component assembly (104) installed in the carriage chassis (102) with the power connector (306). That is, absent outside forces, the torsion spring maintains the tri-lobed torsion stop (120) in an initial, non-rotated position.

In some embodiments, the tri-lobed torsion stop (120) is covered by a safety plate. Such a safety plate insures that the tri-lobed torsion stop (120) is only rotated by a safety cover, rather than manually by personnel handling the carriage chassis. Such a manual rotation of the tri-lobed torsion stop (120) may enable the component assembly (104) to be coupled with the power connector, without installation of safety covers.

The example tri-lobed torsion stop (120) of FIG. 3 also includes a first lobe (308), a second lobe (310), and a third lobe (312). The first lobe (308) is configured to contact the connector housing (110) when no safety cover is installed in the carriage chassis (102), thereby preventing the component assembly (104) installed in the carriage chassis (102) from coupling with the power connector (306). In the example of FIG. 3, the width (302) between the first lobe (308) and the connector housing (110) is less than the width (304) between the component assembly (104) and the power connector (306) such that upon translation of the carriage chassis (102) and the component assembly (104) toward the power connector (306), the first lobe (308) will contact the connector housing (110) prior to the component assembly (104) coupling with the power connector (306). In this way, the first lobe (308) prevents the component assembly (104) from coupling with the power connector (306) when no safety cover is installed—that is, when the tri-lobed torsion stop (120) is in its initial, non-rotated position. The operation of the first lobe (308), the second lobe (310), and third lobe (312), when a safety cover is installed in the carriage chassis (102) is discussed below in detail with respect to FIG. 4A and FIG. 4B.

For further explanation, FIG. 4A sets forth a birds eye view of an exemplary carriage chassis (102) with a tri-lobed torsion stop (120) in accordance with embodiments of the present invention when a safety cover (106) is installed in the carriage chassis (102) and a component assembly installed in the carriage chassis is not coupled with a power connector. The carriage chassis (102) in the example of FIG. 4A is installed in a support structure. The support structure is similar to the support structures depicted in previous drawings in that the support structure includes a power connector in a connector housing (110). The power connector is adapted to couple to a component assembly installed in the carriage chassis.

The example carriage chassis (102) of FIG. 4A is similar to the carriage chassis of FIG. 3, including as it does a number of rails (314) adapted to receive a component assembly (not shown) and adapted to receive a safety cover (106). The example carriage chassis of FIG. 4A, however, differs from the carriage chassis of FIG. 3 in that in a safety cover (106) is installed in the carriage chassis (102) of FIG. 4A.

At least one of the rails (314) of the example carriage chassis (102) of FIG. 4A includes a tri-lobed torsion stop (120) that comprises a first lobe (308), a second lobe (310), and a third lobe (312). When no safety cover is installed in the carriage chassis (102) the first lobe (308) is configured to contact the connector housing (110), thereby preventing a component assembly installed in the carriage chassis from coupling with the power connector.

The second lobe (310) in the example of FIG. 4A receives contact from a displacement member (122) of the safety cover (106) upon installation of the safety cover (106) in the carriage chassis (102), thereby rotating the tri-lobed torsion stop. In this example, the safety cover (106) includes a notch (406), where the "displacement member" is formed as a sidewall to the notch. The notch (406) and displacement member form a displacement apparatus. In some embodiments, rather than the safety cover (106) comprising a notch (406), a displacement apparatus that includes a displacement member may be attached to the safety cover. The safety cover is installed in the carriage chassis by sliding, or otherwise translating the safety cover, toward the connector housing. The displacement member contacts that second lobe (310), and as the safety cover translates closer to the connector housing (110) the displacement member (122) displaces, or pushes, the second lobe (310), such that the entire tri lobe torsion stop (120) rotates from its initial, non-rotated position (as seen in FIG. 3) to its final rotated position, as seen here in FIG. 3.

Once the tri-lobed torsion stop (120) is rotated to its final position, the first lobe (308) is aligned with connector housing receptacle (404) adapted to receive the first lobe and, as explained below with regard to FIG. 4B, adapted to prevent rotation of the tri-lobed torsion stop (120) once the first lobe is inserted in the receptacle. In the example of FIG. 4A, the connector housing receptacle (404) is formed by the shape of the connector housing, a ninety-degree angle cut-out of a corner of the housing. In other embodiments, however, the receptacle may be a hole, a notch, an additional structure attached to the housing, or other structure as will occur to readers of skill in the art.

The third lobe (312) of the is configured to provide contact to the displacement member (122) of the safety cover (106) when the safety cover is installed in the carriage chassis and a component assembly installed in the carriage chassis is coupled with the power connector. In this example, the component assembly is not coupled with the power connector.

For further explanation, therefore FIG. 4B sets forth a bird's eye view of an exemplary carriage chassis with a tri-lobed torsion stop in accordance with embodiments of the present invention when a safety cover is installed in the carriage chassis and a component assembly installed in the carriage chassis is coupled with a power connector. In the example of FIG. 4B, the carriage chassis (102), the tri-lobed torsion stop (120), the support structure with power connector in the connector housing (110) are similar to those depicted above in the example of FIG. 3 and FIG. 4A.

In this example, however, the first lobe (308) is inserted into a connector housing receptacle (404) and the connector housing receptacle is adapted to prevent rotation of the tri-lobed torsion stop (120). That is, if the tri-lobed torsion stop begins to rotate toward its initial, non-rotated position, the first lobe contacts the connector housing (110) in the connector housing receptacle (404), preventing the first lobe, and thus the entire tri-lobed torsion stop (120), from rotating further.

Such an attempt of rotation of the tri-lobed torsion stop, is initiated when an installed safety cover is being removed. In FIG. 4B, the third lobe (312) of the tri-lobed torsion stop (120) is configured to provide contact to the displacement member (122) of the safety cover (106) when the safety cover is installed in the carriage chassis and a component assembly installed in the carriage chassis is coupled with the power connector. That is, when an installed safety cover is being removed, translating away from the power connector and connector housing (110), the displacement member (122) contacts the third lobe (312) causing the entire tri-lobed torsion stop (120) to rotate toward its initial, non-rotated position. However, as explained above, during such rotation, when the first lobe (308) is inserted into the connector housing receptacle (404), the first lobe contacts the connector housing (110) and the rotation of the tri-lobed torsion stop is prevented. In this way, a safety cover may not be removed when component assembly installed in the carriage chassis (102) is coupled with the power connector. That is, to remove a safety cover from a carriage chassis (102), the carriage chassis with the component assembly must be translated away from the power connector, decoupling the component assembly from power.

In view of the explanations set forth above, readers of skill in the art will recognize that carriage housing with a tri-lobed torsion stop according to embodiments of the present invention provides several benefits including:
 preventing a component assembly from coupling with power, when no safety cover is installed;
 preventing a safety cover from being removed without decoupling a component assembly from power; and
 other benefits as will occur to readers of skill in the art.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A carriage chassis for installation of a component assembly in a support structure, the support structure comprising a power connector in a connector housing, the power connector adapted to couple to a component assembly installed in the carriage chassis, the carriage chassis comprising:
 a plurality of rails adapted to receive a component assembly and adapted to receive a safety cover, wherein at least one of the rails comprises a tri-lobed torsion stop, the tri-lobed torsion stop comprising:
  a first lobe configured to contact the connector housing when no safety cover is installed in the carriage chassis;
  a second lobe configured to receive contact from a displacement member of a safety cover upon installation of the safety cover in the carriage chassis; and
  a third lobe configured to provide contact to the displacement member of the safety cover when the safety cover is installed in the carriage chassis and a component assembly installed in the carriage chassis is coupled with the power connector, wherein:
  the third lobe and the first lobe prevent removal of the safety cover when the safety cover is installed in the carriage chassis and a component assembly installed in the carriage chassis is coupled with the power connector.

2. The carriage chassis of claim 1 wherein the tri-lobed torsion stop is coupled to the at least one rail with a fastener, and the tri-lobed torsion stop further comprises a torsion spring, the torsion spring configured to return the tri-lobed torsion stop to a first position upon removal of a safety cover, the first position of the tri-lobed torsion stop preventing coupling of a component assembly installed in the carriage chassis with the power connector.

3. The carriage chassis of claim 1 wherein the safety cover further comprises a notch adapted to receive the third lobe.

4. The carriage chassis of claim 1 wherein the safety cover further comprises a displacement apparatus fastened to the safety cover.

5. The carriage chassis of claim 1 wherein the tri-lobed torsion stop is covered by a safety plate.

6. The carriage chassis of claim 1 wherein the component assembly comprises a card assembly that includes a plurality of printed circuit boards.

7. The carriage chassis of claim 6 wherein the component assembly further comprises a liquid-cooled cold plate.

8. The carriage chassis of claim 1 wherein support structure is a test fixture that includes one or more rack slots and testing apparatus.

9. A support structure, the support structure comprising:
support rails for receiving a carriage chassis, the carriage chassis configured to receive a component assembly for installation in the support structure; and
a power connector in a connector housing, the power connector adapted to couple to a component assembly of the carriage chassis when the carriage chassis is installed in the support structure, wherein the carriage chassis further comprises:
a plurality of rails adapted to receive a component assembly and adapted to receive a safety cover, wherein at least one of the rails comprises a tri-lobed torsion stop, the tri-lobed torsion stop comprising:
a first lobe configured to contact the connector housing when no safety cover is installed in the carriage chassis;
a second lobe configured to receive contact from a displacement member of a safety cover upon installation of the safety cover in the carriage chassis; and
a third lobe configured to provide contact to the displacement member of the safety cover when the safety cover is installed in the carriage chassis and a component assembly installed in the carriage chassis is coupled with the power connector, wherein:
the third lobe and the first lobe prevent removal of the safety cover when the safety cover is installed in the carriage chassis and a component assembly installed in the carriage chassis is coupled with the power connector.

10. The support structure of claim 9 wherein the tri-lobed torsion stop is coupled to the at least one rail with a fastener, and the tri-lobed torsion stop further comprises a torsion spring, the torsion spring configured to return the tri-lobed torsion stop to a first position upon removal of a safety cover, the first position of the tri-lobed torsion stop preventing coupling of a component assembly installed in the carriage chassis with the power connector.

11. The support structure of claim 9 wherein the safety cover further comprises a notch adapted to receive the third lobe.

12. The support structure of claim 9 wherein the safety cover further comprises a displacement apparatus fastened to the safety cover.

13. The support structure of claim 9 wherein the tri-lobed torsion stop is covered by a safety plate.

14. The support structure of claim 9 wherein the component assembly comprises a card assembly that includes a plurality of printed circuit boards.

15. The support structure of claim 14 wherein the component assembly further comprises a liquid-cooled cold plate.

16. The support structure of claim 9 wherein the support structure comprises a test fixture that includes one or more rack slots and testing apparatus.

* * * * *